United States Patent
Clark et al.

(10) Patent No.: US 12,382,690 B2
(45) Date of Patent: Aug. 5, 2025

(54) STRUCTURE AND METHOD USING A SINGLE CRYSTALLINE BIXBYITE OXIDE LAYER IN A ORIENTATION

(71) Applicant: IQE plc, Cardiff (GB)

(72) Inventors: Andrew Clark, Mountain View, CA (US); Rytis Dargis, Greensboro, NC (US)

(73) Assignee: IQE plc, Cardiff (GB)

( * ) Notice: Subject to any disclaimer, the term of this patent is extended or adjusted under 35 U.S.C. 154(b) by 581 days.

(21) Appl. No.: 17/734,549

(22) Filed: May 2, 2022

(65) Prior Publication Data
US 2022/0359668 A1    Nov. 10, 2022

(30) Foreign Application Priority Data
May 4, 2021 (GB) ..................... 2106335

(51) Int. Cl.
*H10D 62/85* (2025.01)
*H10D 62/40* (2025.01)
(Continued)

(52) U.S. Cl.
CPC ....... *H10D 62/8503* (2025.01); *H10D 62/405* (2025.01); *H10D 62/80* (2025.01);
(Continued)

(58) Field of Classification Search
CPC ......... H01L 21/02433; H01L 21/02483; H01L 21/02488; H01L 21/02516; H01L 21/0254; H01L 21/02609; H01L 21/02381; H01L 21/02538; H01L 21/02502; H01L 21/20; H01L 21/02631; H01L 29/2003;
(Continued)

(56) References Cited

U.S. PATENT DOCUMENTS

| 5,937,274 A | * | 8/1999 | Kondow | ........... H01L 21/02392 257/E27.128 |
| 7,012,016 B2 | | 3/2006 | Gwo | |

(Continued)

FOREIGN PATENT DOCUMENTS

WO    WO-2017165197 A1  *  9/2017  ....... H01L 21/02381

OTHER PUBLICATIONS

Search Report in Great Britain Application No. 2106335.9, United Kingdom Intellectual Property Office, South Wales, mailed Feb. 15, 2022, 3 pages.
Extended European Search Report in European Application No. 22169996.0, European Patent Office, Munich, mailed Oct. 5, 2022, 5 pages.

*Primary Examiner* — William B Partridge
*Assistant Examiner* — Erik A. Anderson
(74) *Attorney, Agent, or Firm* — Sterne, Kessler, Goldstein & Fox P.L.L.C.

(57) ABSTRACT

A layered structure including a substrate in [100] crystal orientation, a crystalline bixbyite oxide layer in [111] orientation, and a metal-containing layer crystallographically matched to the crystalline bixbyite oxide layer. Also a method of fabricating a layered structure comprising steps to: epitaxially deposit a crystalline bixbyite oxide in [111] orientation on a substrate in [100] crystal orientation; and deposit a metal-containing layer on the crystalline bixbyite oxide layer.

15 Claims, 5 Drawing Sheets

(51) Int. Cl.
*H10D 62/80* (2025.01)
*H10F 77/124* (2025.01)
*H10H 20/825* (2025.01)
*H10D 30/47* (2025.01)

(52) U.S. Cl.
CPC ......... *H10D 30/47* (2025.01); *H10F 77/1246* (2025.01); *H10H 20/825* (2025.01)

(58) Field of Classification Search
CPC ..... H01L 29/045; H01L 29/24; H01L 29/778; H01L 31/03044; H01L 33/32; C30B 23/02; C30B 23/025; C30B 29/02; C30B 29/16; C30B 29/40; C30B 29/403; C30B 29/406; C30B 29/52; H10D 62/8503; H10D 62/405; H10D 62/80; H10D 30/47; H10F 77/1246; H10H 20/825
See application file for complete search history.

(56) References Cited

U.S. PATENT DOCUMENTS

| | | | | |
|---|---|---|---|---|
| 8,106,381 | B2* | 1/2012 | Atanackovic | H10D 30/751 257/18 |
| 8,846,504 | B1 | 9/2014 | Dargis et al. | |
| 10,605,987 | B2 | 3/2020 | Clark et al. | |
| 11,063,114 | B2 | 7/2021 | Dargis et al. | |
| 2011/0284048 | A1* | 11/2011 | Haass | H10D 62/8164 438/54 |
| 2013/0334536 | A1 | 12/2013 | Dargis et al. | |
| 2014/0167057 | A1* | 6/2014 | Arkun | H10D 62/8503 257/190 |
| 2018/0017516 | A1* | 1/2018 | Dobrokhotov | G01N 27/125 |
| 2018/0138284 | A1* | 5/2018 | Pelzel | H01L 21/02123 |
| 2019/0081210 | A1* | 3/2019 | Kuo | B32B 7/12 |
| 2019/0227233 | A1* | 7/2019 | Clark | H01L 21/02381 |
| 2019/0280143 | A1* | 9/2019 | Ding | H10F 19/10 |
| 2021/0005720 | A1 | 1/2021 | Dargis et al. | |

* cited by examiner

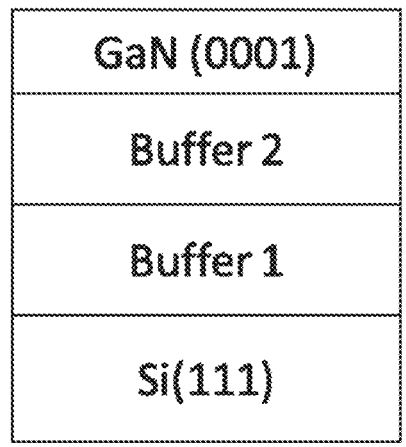
FIG. 1: Prior Art
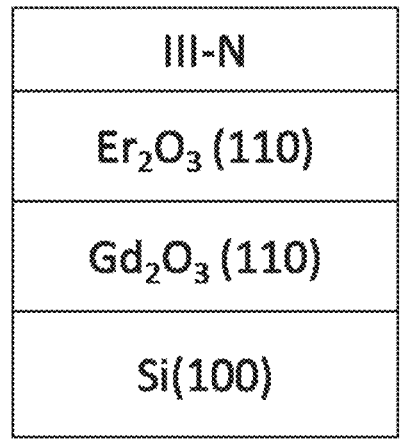
FIG. 2: Prior Art
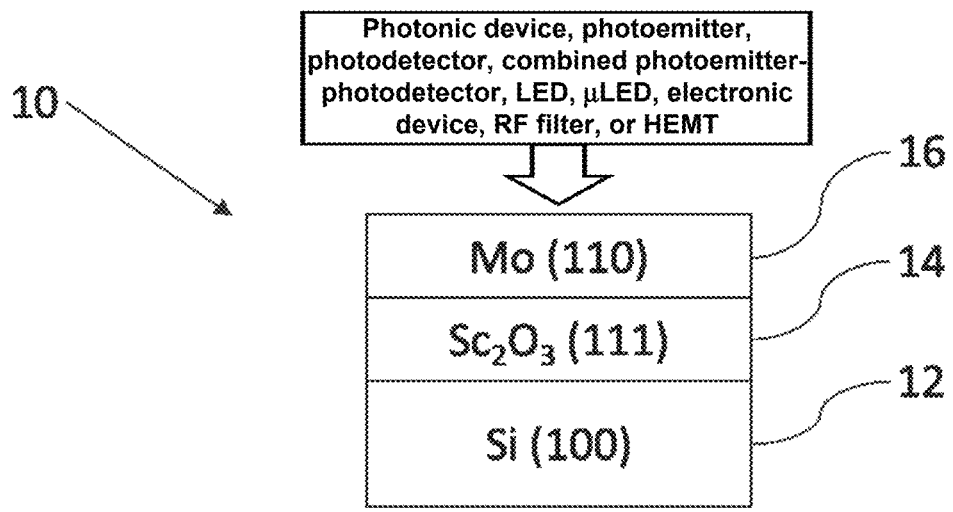
FIG. 3

FIG. 4: Prior Art
FIG. 5

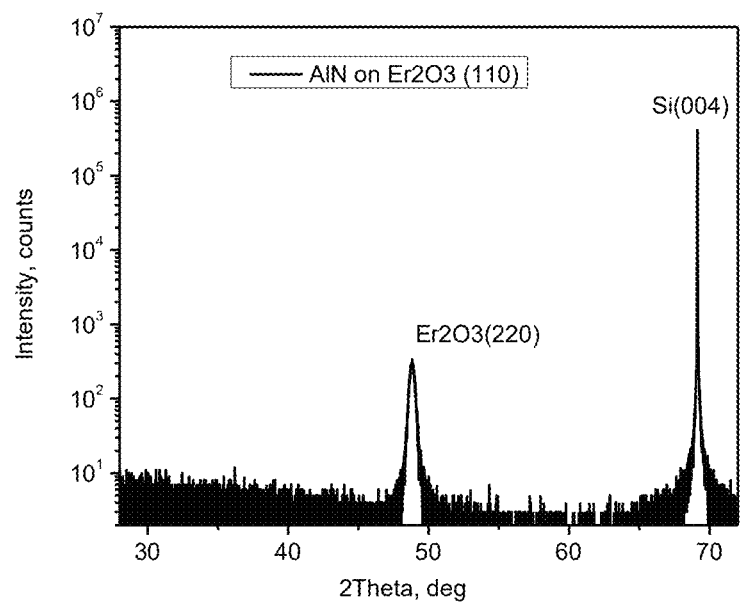
FIG. 8: Prior Art
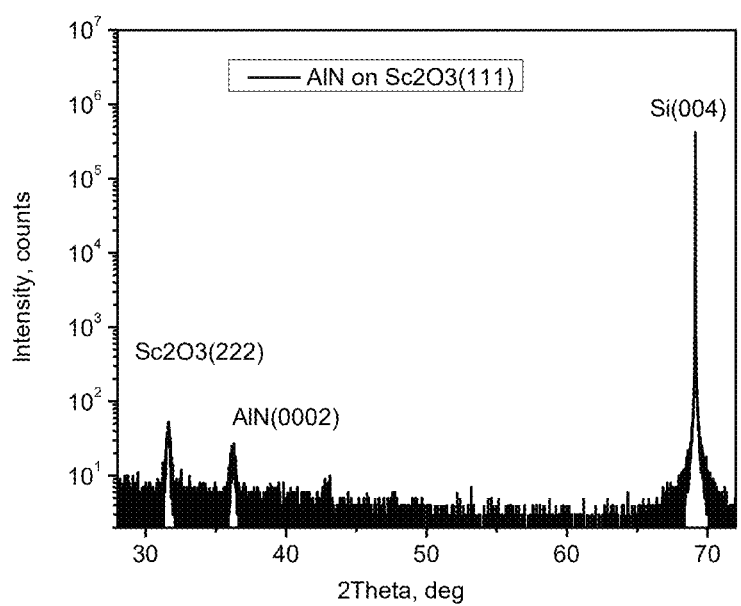
FIG. 9

STRUCTURE AND METHOD USING A SINGLE CRYSTALLINE BIXBYITE OXIDE LAYER IN A ORIENTATION

CROSS REFERENCE TO RELATED APPLICATION

This application claims priority to GB Application No. 2106335.9, filed May 4, 2021, which is hereby incorporated herein in its entirety by reference.

BACKGROUND

A layered structure, particularly but not exclusively for growing III-N materials on Si (100) substrates or for growing metal-containing materials on Si (100) substrates.

Many applications require a good quality III-N layer on which to grow or place one or more device layers. For example, a radio frequency (RF) switch may be grown epitaxially on a gallium nitride (GaN) layer in order to obtain suitable properties. Typically there are multiple layers on a substrate below the GaN layer.

For epitaxial growth the crystal structure of a layer must match or be compatible with the layer below it. Each layer's crystal alignment is dictated by the lowest energy state of the material and the crystal orientation of the layer below it. Thus for homoepitaxy (growth of the same material as the preceding layer) the crystal orientation will be identical and for most heteroepitaxy (growth of a different material to the preceding layer) the crystal orientation will also be the same. Where the crystal structure of the subsequent layer is different, for example GaN in hexagonal form grown on silicon which is cubic, the subsequent layer grows in a compatible crystal orientation. Thus GaN grows in the polar [0001] orientation on Si (111) but grows in the semi-polar [11-20] orientation on a (110) rare earth oxide previous layer.

It has previously been determined that crystalline rare earth oxides epitaxially grow with a different crystal orientation to the layer below them. This is called "epi Twist™" by the applicant. This can be used to grow a subsequent layer with a different crystal orientation to the substrate or a previous layer, provided that the lattice constants are approximately matched or that the upper layer has a lattice constant which is an integer multiple of the lattice constant of the lower layer.

It is known to grow GaN (0001) on a Si (111) substrate using a double buffer, U.S. Pat. No. 7,012,016. This is illustrated in FIG. 1.

It is also known, from U.S. Pat. No. 8,846,504, to grow GaN (11-20) on Si (100) by using a first gadolinium oxide layer which twists to (110) and a second erbium oxide layer which has a lattice constant closer to that of GaN (11-20). This is illustrated in FIG. 2.

Wurtzitic (c-direction) III-N materials such as GaN [0001] are preferable in the industry for electronic and photonic devices. For electronic devices, the polar nature of this form of GaN is required for a high electron mobility transistor (HEMT) to be fabricated. It is also preferable to use Si (100) substrates because they are widely available, and therefore cheap. They are also commercially available in larger diameters, up to 300 mm, than other orientations of silicon such as Si (111). Furthermore Si (100) offers integration opportunities for photonic devices with electronic devices which are commonly produced on Si (100).

One problem with current GaN chips is that to integrate them in a module with the driving electronics it is necessary to bond the GaN chip to a module on Si (100) and then connect them with wires. This introduces an additional failure mode and losses. It may also limit the speed of the device to the current capacity of the wire.

The present invention seeks to provide a layer structure that prevents or overcomes the above-mentioned problems.

SUMMARY

The present invention provides a layered structure comprising: a substrate in [100] orientation or with a miscut up to 20°; a crystalline bixbyite oxide layer in [111] orientation positioned, grown or deposited on the substrate; and a metal-containing layer crystallographically matched to the crystalline bixbyite oxide layer.

The crystalline bixbyite oxide layer in [111] orientation is advantageous because it enables high quality metal or metal-containing materials to be grown on substrates in [100] orientation. Advantageously photonic and power devices can be grown on such materials. For example, HEMT, RF switches, memory devices, actuators and sensors can all be grown, deposited or bonded onto high quality metal or metal-containing layers. Advantageously higher crystal quality improves device performance. For example, a single crystal orientation in the out of plane direction results in a stronger piezoelectric field in the desired crystallographic direction for RF filters and HEMTs.

The crystalline bixbyite oxide layer may be directly positioned, grown or deposited on the substrate. Thus there are no intervening layers.

The substrate may comprise silicon (Si). Advantageously Si (100) is widely available in large diameter wafers and is commonly used for electronic devices. Advantageously devices grown on a layered structure according to the present invention can be integrated with different devices directly grown on Si (100), known as heterointegration. Where a device grown on Si (100) is the driving power electronic device for that grown on the layered structure described herein this may obviate the need for wiring to connect the devices. Advantageously the device performance becomes the speed-limiting factor and not the wiring. Advantageously a potential failure mode is removed by omitting the wiring.

The crystalline bixbyite oxide may be epitaxial. Advantageously it is easier to obtain good crystallinity by epitaxial deposition or growth.

The crystalline bixbyite oxide may be a rare earth oxide. The crystalline bixbyite oxide may be scandium oxide ($Sc_2O_3$). Advantageously scandium oxide grows in [111] orientation on Si (100). Advantageously high quality metal or metal-containing materials can be grown in beneficial orientations on $Sc_2O_3$ (111).

The metal-containing layer may be epitaxial. Advantageously the metal-containing layer may be grown, deposited, immediately after the crystalline bixbyite oxide layer in the same tool. Advantageously the risk of contamination being introduced between the layers is reduced or eliminated.

The metal-containing layer may be a III-N material. It may be gallium nitride (GaN). Advantageously this is a good material for HEMTs, for example. It may be aluminium nitride (AlN). This is a good material for piezoelectric devices such as radio frequency filters. It may be molybdenum (Mo). This is a good material for a back electrode of a filter or an effective reflective layer or back contact for a photonic device. It is also a good material for subsequent growth of III-(RE)-N materials for HEMT barriers in filters.

The metal-containing layer may be sputtered. Advantageously the substrate with crystalline bixbyite oxide layer may be provided as a template. The metal-containing layer may be sputtered onto the template in the same or a different manufacturing location. For example, one party may produce the template and a second party may receive the template and sputter the metal-containing layer onto it. Alternatively the template may be produced in one location and the metal-containing layer may be sputtered onto it at another location by the same or an affiliated entity. In some instances sputtering the metal-containing layer may be cheaper and/or quicker than epitaxial growth or another deposition method.

The sputtered metal-containing layer may be Mo. Advantageously Mo is commonly sputtered in the industry and therefore the process for sputtering Mo is mature and repeatable. Alternatively the sputtered material may be a III-N material such as GaN or AlN.

The present invention also provides a photonic device comprising the layered structure as described. The photonic device may be a photoemitter; a photodetector; or a combined photoemitter and photodetector. It may be an LED or a micro-LED. Advantageously each of these applications benefits from the heterointegration benefits and/or the higher quality metal-containing layer of the present layered structure.

The present invention also provides an electronic device; a radio frequency filter; or a high electron mobility transistor comprising the layered structure as described. Advantageously each of these applications benefits from the heterointegration benefits and/or the higher quality metal-containing layer of the present layered structure.

The present invention also provides a method of fabricating a layered structure comprising steps to: epitaxially deposit a crystalline bixbyite oxide in [111] orientation on a substrate in [100] crystal orientation or miscut by up to 20°; and deposit a metal-containing layer on the crystalline bixbyite oxide layer.

Advantageously the method provides higher quality metal or metal-containing materials on a commonly used orientation of substrate. Advantageously higher crystal quality improves device performance. For example, a single crystal orientation in the out of plane direction results in a stronger piezoelectric field in the desired crystallographic direction for RF filters and HEMTs.

The step to deposit the metal-containing layer may comprise epitaxial deposition. Advantageously it can be performed immediately after the step to epitaxially deposit the crystalline bixbyite oxide layer, and in the same tool.

Alternatively, the step to deposit the metal-containing layer may comprise sputtering. Advantageously this layer can be added at a different time and/or location. Advantageously sputtering is a mature process in the industry providing cheap and repeatable results.

BRIEF DESCRIPTION OF THE DRAWINGS/FIGURES

The present invention will be more fully described by way of example with reference to the accompanying drawings, in which:

FIG. 1 is a prior art layer stack for growing III-N on silicon;

FIG. 2 is a prior art layer stack for growing III-N on silicon;

FIG. 3 is a layer stack according to the present invention;

FIG. 4 is a RHEED plot of prior art growth of Mo on a rare earth oxide;

FIG. 5 is a RHEED plot of growth of Mo on a rare earth oxide according to the present invention;

FIG. 8 is an XRD plot of prior art growth of AlN on a rare earth oxide;

FIG. 9 is an XRD plot of growth of AlN on a rare earth oxide according to the present invention.

DETAILED DESCRIPTION

Figure 6:
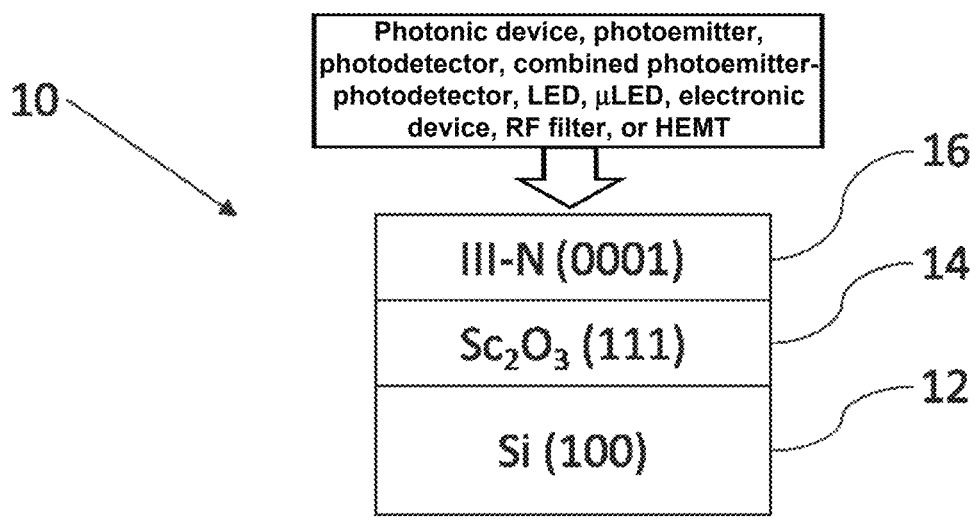
FIG. 6 is a layer stack according to the present invention.

Throughout this disclosure, as will be understood by the skilled reader, crystal orientation <100> means the face of a cubic crystal structure and encompasses [100], [010] and [001] orientations using the Miller indices. Similarly <0001> encompasses [0001] and [000-1] except if the material polarity is critical. Integer multiples of any one or more of the indices are equivalent to the unitary version of the index. For example, (222) is equivalent to, the same as, (111).

The invention will now be described more particularly with reference to FIG. 3. A layer structure 10 is shown which has a substrate 12, a crystalline bixbyite oxide layer 14 and a metal-containing layer 16. The substrate 12 is on-axis silicon, thus it has <100> crystal orientation. As will be understood by the skilled reader, crystal orientation <100> means the face of a cubic crystal structure and encompasses [100], [010] and [001] orientations using the Miller indices. References herein to Si (100) also encompass a silicon substrate 12 which is miscut by up to 20° towards another crystallographic direction, for example towards the (111) plane.

Si <100> is readily available in large volumes at relatively low cost because it is used for consumer electronics such as computer chips for processing, memory, or graphics. Si <100> is also widely used for the electronic circuits which drive photonic devices, such as complementary metal-oxide semiconductors (CMOS), because of its high charge carrier mobility (higher than in other orientations of Si). There is therefore an integration benefit to be gained by growing the photonic device on Si <100>, with suitable layers in between, if sufficient crystal quality can be obtained.

The silicon substrate 12 may be monolithic; that is comprising bulk single crystal silicon throughout. Alternatively the silicon substrate 12 may also comprise porous silicon for some or all of its thickness, for example it may form a sublayer. The substrate 12 may include an upper portion which is porous with a lower portion that is non-porous. Alternatively the substrate 12 may include one or more discrete, non-continuous portions that are porous with the remainder being non-porous (with bulk silicon properties). The portions may be non-continuous within the plane of a sublayer and/or through the thickness of the layer (horizontally and/or vertically in the sense of the growth direction). The portions may be distributed in a regular array or irregular pattern across the substrate 12, and/or through it. The porosity may be constant or variable within the porous regions. Where the porosity is variable it may be linearly varied through the thickness, or may be varied according to a different function such as quadratic, logarithmic or a step function.

Alternatively the substrate may comprise silicon-germanium (SiGe), for example $Si_{0.8}Ge_{0.2}$, or silicon on insulator (SOI).

A single crystal crystalline bixbyite oxide layer 14 is positioned, grown or deposited on the substrate 12. The crystalline bixbyite oxide layer 14 may be a rare earth oxide (REO) layer. The rare earth elements are scandium (Sc), yttrium (Y) and all of the lanthanoid series which is lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu). The bixbyite oxides are bixbyite in crystal structure. Other bixbyite oxides include indium oxide ($In_2O_3$), vanadium oxide ($V_2O_5$), iron oxide ($Fe_2O_3$), manganese oxide ($Mn_2O_3$) and ternary compounds of a rare earth, a metal and oxygen (RE-M-O).

Preferably the crystalline bixbyite oxide layer 14 is epitaxially deposited. When a crystalline bixbyite oxide is deposited on a substrate 12, or another layer, at sufficient surface temperature, low enough oxygen concentration and slow enough growth rate it does not match the crystal orientation of the previous layer, depending on the orientation of the substrate 12 or previous layer. Instead it grows in a different orientation, a process called "epi Twist™" by the inventors. When growing most crystalline bixbyite oxides on Si (100) the crystalline bixbyite oxide layer 14 grows in [110] orientation which has lower surface energy than [100] orientation.

Advantageously the present inventors have determined that only a single crystalline bixbyite oxide layer 14 is required to both change the crystal orientation and offer a suitable surface for subsequent layers. This is in contrast to prior art layered structures in which two crystalline bixbyite oxide (rare earth oxide) layers were required, for example as shown in FIG. 1, one to change the crystal orientation and the other to offer a surface with appropriate lattice matching and quality. Advantageously it is quicker, cheaper and easier to grow one crystalline bixbyite oxide layer 14 than to grow two. Advantageously there is one fewer interfaces between layers which means the risk of introduced defects or interlayer strains is reduced. The single crystalline bixbyite oxide layer 14 makes it simpler to balance between surface energy and mismatch energy instead of using one layer to eliminate one of these and the other layer to manage the other.

Advantageously the crystalline bixbyite oxide layer 14 insulates the metal-containing layer 16 from the Si substrate 12 which prevents metal silicide forming. Such silicides would be particularly likely to form, without the crystalline bixbyite oxide layer 14, if metal were deposited at higher temperature in order to improve quality.

FIG. 3 illustrates a layer structure 10 with a substrate 12 comprising Si (100). The crystalline bixbyite oxide layer 14 comprises scandium oxide, $Sc_2O_3$, which grows in [111] orientation on Si (100). The metal-containing layer 16 comprises molybdenum, Mo, which grows in [110] orientation on $Sc_2O_3$ (111). Advantageously this produces high quality Mo which is therefore better for subsequent device layers. This means, for example, that it forms an efficient back electrode for a filter. Alternatively it is an effective reflective layer or back contact for a photonic device. The alignment of the surface atoms of the Mo (110) layer is favourable for growth of III-(RE)-N layers, such as AlN or AlScN, in the <0001> direction. Advantageously nitride layers grown on Mo (110) demonstrate better crystal quality than those grown on Mo (112). FIG. 4 is a Reflection High-Energy Electron Diffraction (RHEED) pattern of growth of Mo on $Er_2O_3$. Mo grows in [112] orientation on $Er_2O_3$ (110). It can be seen that there are several bright streaks which denote diffraction of electrons, and these are not aligned with each other. This indicates that the surface of the layer is faceted rather than smooth. FIG. 5 is a similar RHEED pattern for growth of Mo (110) on $Sc_2O_3$ (111), according to the present invention. It can be seen that there is one bright streak and two first order diffraction streaks, and that they are all parallel, denoting that the crystal quality is better than that seen in FIG. 4.

Scandium oxide, which is a rare earth oxide but not in the lanthanoid series of elements, surprisingly behaves differently to other crystalline bixbyite oxides, particularly rare earth oxides, in that its lowest energy orientation is [111] and so it grows in this orientation on Si (100). The preferred crystal orientation of a material is dependent on its surface energy and the lattice mismatch to the layer below. The arrangement of the atoms within the crystal is also a factor since this affects the spacing between atoms on different surfaces, and whether a surface has only oxygen atoms, only metal atoms or a combination of both. Sc is a smaller atom than the other rare earth elements and the lattice spacing of $Sc_2O_3$ is smaller than for other crystalline bixbyite oxides. Therefore $Sc_2O_3$ (111) exhibits a greater lattice mismatch to Si (100): around −9%. For this reason the surface energy becomes the dominant factor to define crystal orientation whereas in crystalline bixbyite oxides which are better lattice matched to Si (100), for example up to ±2%, the lattice match is the dominant factor even though the surface energy in (110) orientation may be twice that in (111) orientation.

The metal-containing layer 16 may be deposited, epitaxially or otherwise, or may be sputtered. Due to the crystallinity of the crystalline bixbyite oxide layer 14, it has a surface with beneficial orientation on which to grow or deposit the metal-containing layer 16. Such metal-containing layer 16 will therefore be more suitable to support the desired device.

The metal-containing layer 16 has been described as Mo. Alternatively it may be any of the transition metals, such as tantalum (Ta), tungsten (W), platinum (Pt) or nickel (Ni), or a metal from any of groups III to VI of the periodic table, such as Al, Ga, Sn or Sb. Alternatively it may be an alloy between one or more metals and one or more non-metals.

FIG. 6 illustrates a layered structure 10 with a substrate 12 comprising Si (100). The crystalline bixbyite oxide layer 14 comprises scandium oxide, $Sc_2O_3$, which grows in [111] orientation. The metal-containing layer 16 is a III-V semiconductor, which is an alloy of one or more group III material with one or more group V material. Optionally the III-V semiconductor may also include a rare earth, for example being a III-RE-N material. The III-V may be a binary or ternary alloy such as GaN, AlN, InGaN, AlGaN, InN, AlScN, AlYN, GaScN, GaYN, AlYbN, GaYbN. Advantageously hexagonal III-V materials such as GaN grow in Wurtzitic phase on a (111) sub-layer.

The metal-containing layer 16 is a III-N alloy in the [0001] orientation. For example, the III-N may be wurtzite GaN. GaN is widely used for electronic and photonic applications. For example, GaN is used in high electron mobility transistors (HEMTs) and for LED displays.

Currently GaN devices such as HEMTs are connected to Si-based CMOS electronics by wire, for example in telecommunication or internet base stations. The wiring presents a potential failure mode. It may also limit the speed of operation. The present invention permits the growth of GaN devices over Si (100) substrates which can also host CMOS electronics. Since the CMOS electronics and GaN devices are adjacent the wiring is obviated which removes the associated failure modes and means that device performance is governed by the devices themselves and not by the limitations of the connections. Advantageously the ability to grow GaN (0001) means that the inherent charge is available, since the GaN is polar, which enables piezoelectric switching without doping. The GaN device may be configured to manage power, for example by performing step-down voltage conversion in a microprocessor.

Similarly, for LED or μLED applications the GaN-based emitter, or an array of GaN-based emitters, can be grown on Si (100) according to the present layered structure 10. Each emitter corresponds to one pixel of a display. The emitter or emitters can be controlled by electronic control components or devices which are also grown on or mounted on Si (100). Thus the emitters and controls can be collocated, preferably adjacent, so that each pixel in an array can be individually addressed easily and directly. Advantageously the pixels can be lit and switched off quickly and accurately.

Figure 7:
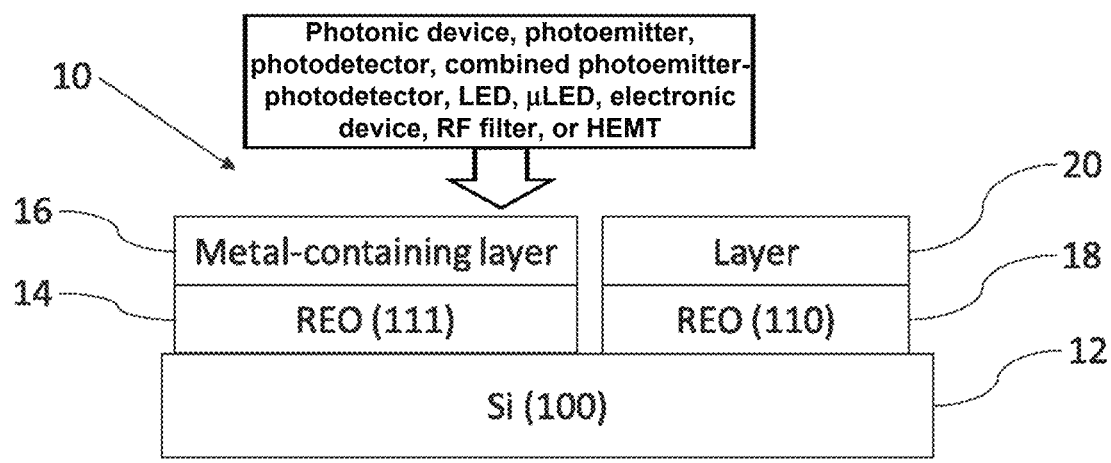
FIG. 7 is a layer stack according to the present invention.

For example, the layered structure 10 may be grown on part of a Si (100) substrate with electronic control components grown on another part of the Si (100) wafer as shown in FIG. 7. The second part of the wafer may include a bixbyite oxide layer 18 in [110] orientation. The bixbyite oxide layer 18 may comprise erbium oxide ($Er_2O_3$) which twists to [110] orientation when grown on Si (100). A layer 20 can then be grown which is compatible with the [110] orientation. For example, the layer 20 may comprise Mo (112).

FIG. 8 is an X-ray Power Diffraction (XRD) plot of a prior art III-N, AlN, grown directly on $Er_2O_3$. It can be seen that there is no XRD peak for AlN meaning the quality is very low. By contrast, when AlN is grown on $Sc_2O_3$, FIG. 9, there is a sharp peak which demonstrates good quality.

Figure 10:
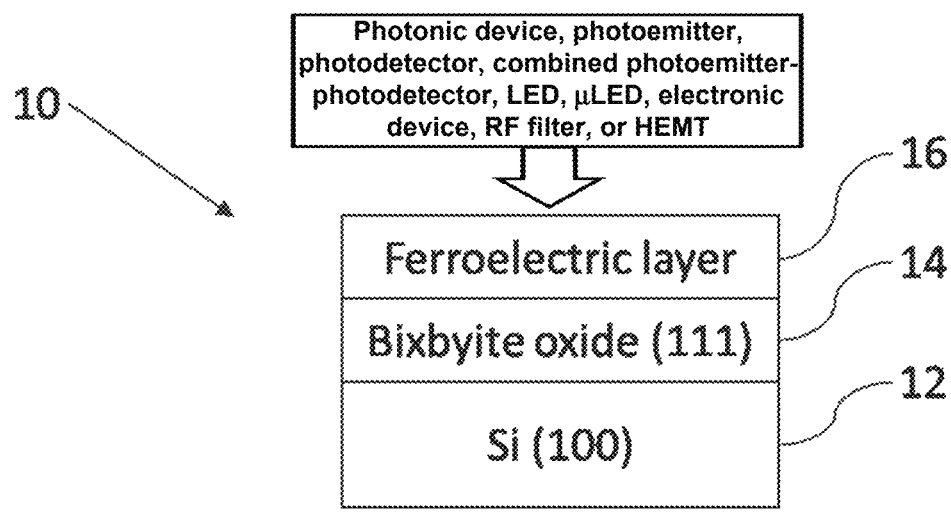
FIG. 10 is a layer stack according to the present invention.

FIG. 10 illustrates a layered structure 10 with a substrate 12 comprising Si (100). A crystalline bixbyite oxide layer 14 in [111] orientation is grown on the substrate 12 as in previous examples. The metal-containing layer 16 comprises a ferroelectric material. The metal-containing layer 16 may include nitrogen. For example, the ferroelectric material may be ScAlN or ScGaN. Such a layer is suitable for memory devices, ferroelectric switches, actuators and sensors. This is because III-(RE)-N materials combine piezoelectric, ferroelectric and pyroelectric properties.

The layered structure 10 may be used for monolithically integrated RF filters which have Si CMOS. Also a GaN-based HEMT monolithically integrated with Si CMOS.

Although the crystalline bixbyite oxide layer 14 has been described as scandium oxide in the [111] orientation, it may alternatively be any bixbyite oxide which twists to the [111] orientation when grown on Si (100).

Although the III-V metal-containing layer 16 has been described as GaN (0001) it could alternatively be AlN, InGaN, AlGaN, InN, AlScN, AlYN, GaScN, GaYN, AlYbN, GaYbN or any III-V alloy as known in the field.

What is claimed is:

1. A layered structure comprising:
   a substrate in [100] crystal orientation or a substrate having a plane with a miscut up to an angle of 20° with respect to a [100] crystal orientation;
   a crystalline bixbyite oxide layer in [111] orientation that is directly on the substrate with no intervening layers between the crystalline bixbyite oxide layer and the substrate; and
   a metal-containing layer crystallographically matched to the crystalline bixbyite oxide layer.

2. The layered structure of claim 1, wherein the substrate comprises silicon.

3. The layered structure of claim 1, wherein the crystalline bixbyite oxide layer is epitaxial.

4. The layered structure of claim 1, wherein the crystalline bixbyite oxide layer is a crystalline rare earth oxide layer.

5. The layered structure of claim 1, wherein the crystalline bixbyite oxide layer is scandium oxide ($Sc_2O_3$).

6. The layered structure of claim 1, wherein the metal-containing layer is epitaxial.

7. The layered structure of claim 6, wherein the metal-containing layer is a III-N material, GaN, AlN, or molybdenum.

8. The layered structure of claim 1, wherein the metal-containing layer is sputtered.

9. The layered structure of claim 8, wherein the metal-containing layer is molybdenum, III-N, AlN, or GaN.

10. A photonic device comprising the layered structure of claim 1.

11. The photonic device of claim 10, wherein the photonic device is a photoemitter, a photodetector, a combined photoemitter and photodetector, a light emitting diode (LED), or a micro-light emitting diode (μLED).

12. An electronic device, a radio frequency (RF) filter, or a high electron mobility transistor (HEMT) comprising the layered structure of claim 1.

13. A method of fabricating a layered structure comprising steps to:
    epitaxially deposit a crystalline bixbyite oxide layer in [111] orientation on a substrate in crystal orientation with no intervening layers between the crystalline bixbyite oxide layer and the substrate; and
    deposit a metal-containing layer on the crystalline bixbyite oxide layer.

14. The method of claim 13, wherein the step to deposit the metal-containing layer comprises epitaxial deposition.

15. The method of claim 13, wherein the step to deposit the metal-containing layer comprises sputtering.

* * * * *